United States Patent

Patterson

[11] Patent Number: 6,051,828
[45] Date of Patent: Apr. 18, 2000

[54] LIGHT EMISSION NOISE DETECTION AND CHARACTERIZATION

[75] Inventor: Joe Patterson, Mission Viejo, Calif.

[73] Assignee: Texas Instruments Incorporated, Dallas, Tex.

[21] Appl. No.: 09/108,876

[22] Filed: Jul. 1, 1998

Related U.S. Application Data

[60] Provisional application No. 60/051,577, Jul. 2, 1997.

[51] Int. Cl.[7] .................................................. H01D 40/14
[52] U.S. Cl. ..................... 250/214 R; 250/207; 324/501; 324/750; 356/311
[58] Field of Search ................................ 250/226, 214 R, 250/207; 356/311, 328, 327, 326, 418, 417, 237; 324/752, 501, 750, 768, 769, 763, 765

[56] References Cited

U.S. PATENT DOCUMENTS

| | | | |
|---|---|---|---|
| 4,680,635 | 7/1987 | Khurana | 358/211 |
| 5,049,811 | 9/1991 | Dreyer et al. | 324/537 |
| 5,301,006 | 4/1994 | Bruce | 356/311 |
| 5,408,094 | 4/1995 | Kajimura | 250/234 |
| 5,475,316 | 12/1995 | Hurley et al. | 324/750 |
| 5,504,431 | 4/1996 | Maeda et al. | 324/501 |
| 5,532,607 | 7/1996 | Inuzuka et al. | 324/750 |
| 5,583,635 | 12/1996 | Miura et al. | 356/338 |
| 5,592,211 | 1/1997 | Porter et al. | 347/260 |
| 5,602,489 | 2/1997 | El-Kareh et al. | 324/75.1 |
| 5,602,639 | 2/1997 | Kohno | 356/237 |
| 5,608,519 | 3/1997 | Gourley et al. | 356/318 |
| 5,610,405 | 3/1997 | Inushima et al. | 250/372 |
| 5,648,275 | 7/1997 | Smayling et al. | 437/8 |
| 5,724,131 | 3/1998 | Chim et al. | 356/237 |

Primary Examiner—John R. Lee
Attorney, Agent, or Firm—W. Daniel Swayze, Jr.; Wade James Brady, III; Richard L. Donaldson

[57] ABSTRACT

An integrated circuit 100 emits light corresponding to a defect in the integrated circuit 100. The light is transformed to electrical signals by a photomultiplier 206. The spectral content of the electrical signals is compared with predetermined or known noise signatures to identify the defects in the integrated circuit 100.

2 Claims, 2 Drawing Sheets

FIG. 2

LIGHT EMISSION NOISE DETECTION AND CHARACTERIZATION

This application claims priority under 35 USC § 119(e)(1) of provisional application No. 60/051,577 filed Jul. 2, 1997.

FIELD OF THE INVENTION

The invention relates generally to the field of testing semiconductor circuits and, more particularly, to an improved emission microscope for testing semiconductor circuits.

BACKGROUND OF THE INVENTION

It is well known that integrated circuits can suffer from a variety of failure mechanisms, some of which occur in the process or under use conditions.

Today's integrated circuits are both vertically and horizontally integrated and can incorporate multiple levels of metallization. The increased metallization has led to higher chip clock rates with increasing speeds becoming necessary. To permit defect-free production, failure mechanisms must be precisely located within the complex three-dimensional structure of the circuit.

Locating defects requires two types of instruments namely, sophisticated imaging systems and test equipment capable of exercising the circuit under normal clock operating rates. The image emission microscope localizes defects in integrated circuits. The emission microscope is based on the principle of recombinant radiation. In excess current drawing conditions, such that occurs during failure, electrons and holes in silicon recombine and relax, giving off a photon of light which is readily detectable by specialized sensors, for example, a CCD sensor. Semiconductor manufacturers typically perform this technique on wafers and on delidded or decapsulated finished devices. The technique is utilized to locate the exact location of defects both on the chip face and beneath overlying metallization, thereby permitting location of defects within the 3-dimensional environment of the circuit.

Prior art for biasing of the chip during such testing has generally included two-channel DC power supplies or curve tracers which provide basic power requirements to the chip. Consequently, in the design of semiconductor devices, it is often desired to analyze the current flow through the various circuits. Such analysis is particularly beneficial with respect to integrated circuit to isolate it points of potential failure.

Avalanche breakdown can be analyzed by observing emitted light. The light is emitted as a result of electroluminesence of silicon avalanche. Thus, light emission in this situation enables the detection and location of areas of current flow.

Oxide defects can be detected by observing the light emitted upon application of a current. By observing the emitted light, the points of failure of damaged products can be determined and the analysis of design flaws and/or process flaws can be advantageously undertaken.

Finally, the profile and detailed effects of an ESD (electrostatic discharge) event in an integrated circuit may be determined. During ESD, P-N junctions become forward biased or even go into avalanche breakdown. In either case, light is emitted. By profiling the emitted light pattern, the profile of ESD event can be observed and the area of dissipation of the ESD energy can be determined.

FIG. 1 illustrates a prior art intensified camera 50 and a CCD camera 60.

SUMMARY OF THE INVENTION

An emission microscope providing timed resolution and high sensitivity in the viewing of light emitted from semiconductor devices is described. A microscope optic system is coupled to an image intensifier, which is in turn connected to a spectrum analyzer to determine the noise characterization of light emissions from the semiconductor devices to categorize normal and abnormal devices. Thus, the present invention discriminates between normal and abnormal devices based upon the noise characteristics from the light emitted from the semiconductor device.

With the present invention, a circuit in a semiconductor device is energized and light is generated at points of defect. The light travels through an objective lens and to a mirror which reflects the light to a camera. The light is detected and transformed to electrical signals which is input to a spectrum analyzer. The spectrum analyzer analyzes the signals based on the spectral content of the light. The output of the spectrum analyzer is input to a computer and compared with predetermined noise signatures to determine a match with the predetermined noise signatures to indicate if a defect has occurred.

BRIEF DESCRIPTION OF THE INVENTION

DETAILED DESCRIPTION OF THE INVENTION

Figure 1:
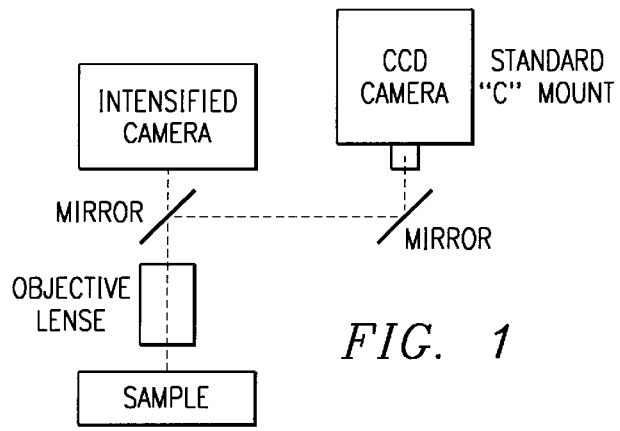
FIG. 1 illustrates an intensified camera with a CCD camera.
Figure 2:
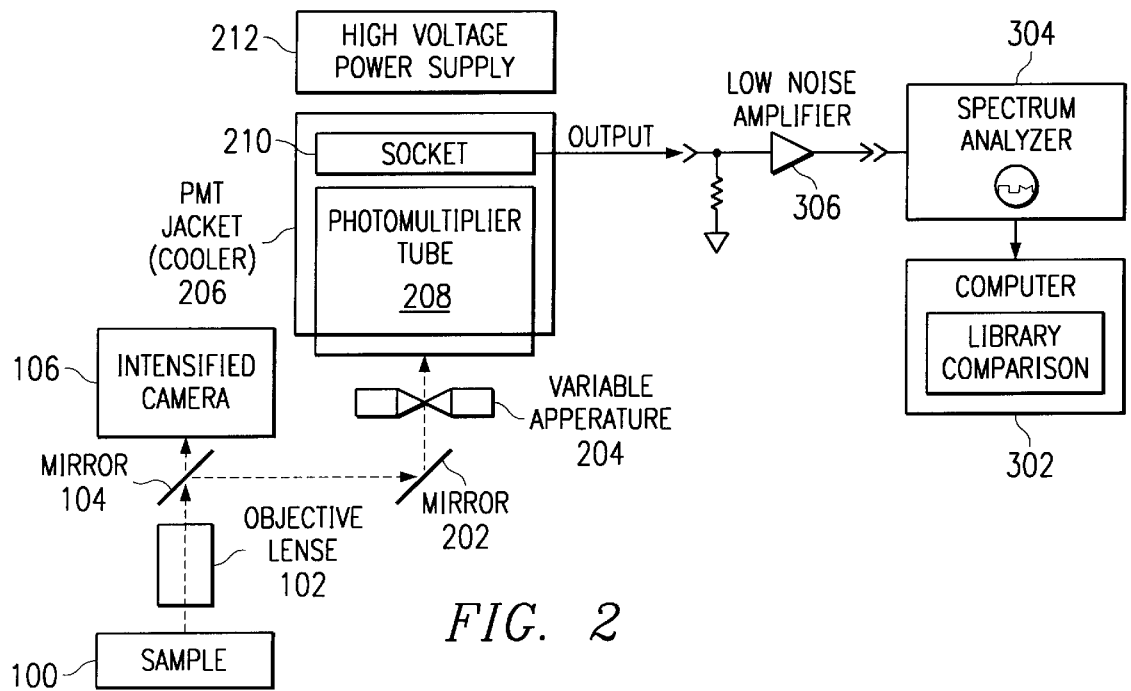
FIG. 2 illustrates a diagram of the present invention.

FIG. 2 illustrates an integrated circuit 100 to be observed that is positioned beneath the microscopic optics 102. The microscopic optics 102 is positioned under an image intensifier 106, for example, an intensified camera. The image intensifier 106 amplifies the optical data from the microscopic optics 102.

The output of the microscopic optics 102 is directed to a camera 206 for converting the optical image into electrical signals. The camera 206 is coupled to a low noise amplifier 306 for amplifying the electrical signals. The low noise amplifier 306 is coupled to a spectrum analyzer 304, which analyzes the spectrum of the signals output from the amplifier 306. The spectrum analyzer 304 is coupled to a computer 302 which stores predetermined noise signatures which indicate a defect and which compares the output of the spectrum analyzer with these noise signatures.

The integrated circuit 100 is energized. The integrated circuit emits light which originates from a defect in the integrated circuit. The light from the integrated circuit is input to microscopic optics 102. The light is focused by the microscopic optics 102. The light output from the microscopic optics 102, which may be an objective lens, is output to a mirror 104. The mirror 104 both reflects a first portion of the light output from the microscopic optics 102 to mirror 202 as a second portion of the light output from the microscopic optics 102 is output to the image intensifier 106. The mirror 202 reflects the first portion of the output of the microscopic optics 102 to a variable aperture 204. This variable aperture 204 directs the light output from mirror 202 to a plurality of photomultiplier tubes or microchannels of the photomultiplier 206. The output of the microscopic optics 102 is generally too faint to be discernible by the typical camera. In order to provide a stronger image, the photomultiplier 206 or a transforming device is utilized to transform the light to electrical signals. This photomultiplier 206 includes a plurality of photomultiplier tubes 204 or microchannels. The photomultiplier increases the brightness of the image formed by the microscopic optics 102 by a factor of 10,000 to 1,000,000. The photomultiplier tubes 204 can detect radiation in the visible and near-infrared spectrum. The wavelength of emitted light of the integrated circuit device is typically in the range of $0.4\mu$ to 1.2 microns. The present invention detects emitted light from silicon as the result of recombination of electron and holes. The output of the photomultiplier 206 may be gated so as it acts as an electronic shutter. This provides time resolution.

The photomultiplier tube includes a plurality of microchannels, each representing a picture element (pixel) of the final display.

Figure 3A:
FIG. 3 illustrates waveforms of a collector of a transistor.
Figure 3B:
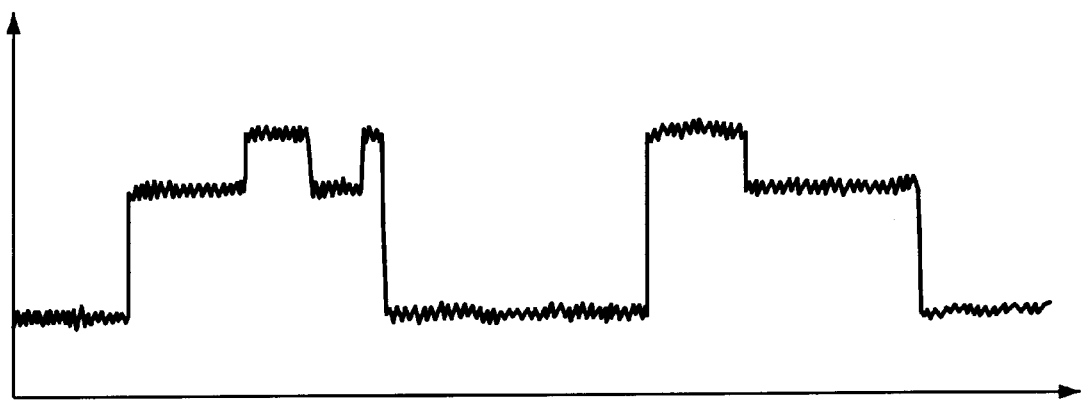
Figure 3C:
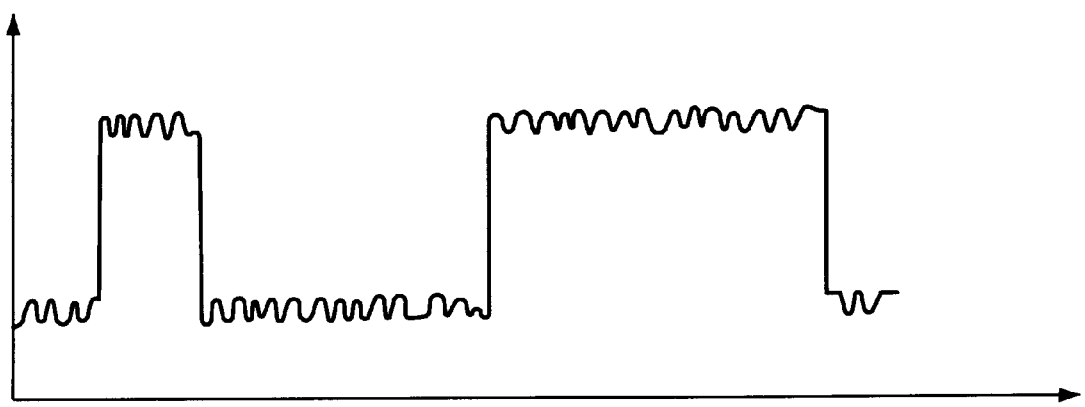

For some applications, the brightness level of the emitted light is very faint, and a very low number of photons is emitted. And consequently, the average number of photons per pixel may be less than one. A large variation with a low number of photoelectrons can cause flickering of the image. Additionally, as illustrated in FIG. 3, there is noise associated with the output at the various elements of the devices. For example, as shown in FIG. 3, noise is shown with typical noise bursts observed at the collector of a transistor.

In operation, an integrated circuit 100 is energized. Light from the integrated circuit 100 is output from the integrated circuit 100 to the microscopic optics 102. The microscopic optics 102 provides a focused image to mirror 104. A first portion of the focused image is output from mirror 104 to mirror 202. Additionally, a portion of the focused image is output from the mirror 104 to the image intensifier 106. The focused image is reflected from mirror 202 and passes through variable aperture 204 to the photomultiplier 206. Each photomultiplier tube 208 of the photomultiplier corresponds to a pixel of the electrical image output from the photomultiplier tube 206. The electrical signal representing the image output from the photomultiplier 206 is amplified by an amplifier 306. The output which is an amplified electrical signal is input to a spectrum analyzer 304. The spectrum analyzer analyzes the signal to produce a spectral content signal representing the spectral content of the image from the integrated circuit 100. The output of the spectrum analyzer is input to the computer 302. The computer 302 analyzes the spectral content signal based on predetermined noise signatures of the total emission spectrum and the spectral content signal is compared with the predetermined noise signature. This comparison determines information concerning the type of defect. This allows noise spectrum analysis at any internal point within the integrated circuit 100.

The electrical signals representing the pixels of the image from the integrated circuit are amplified by the amplifier 306. The amplified electrical signals are analyzed by the spectrum analyzer 304. The spectrum analyzer 304 analyzes the electrical signal to determine the spectral content of the pixels. The spectral content is transmitted to computer 302 or a comparison device, which compares the spectral content with predetermined or known noise signatures to determine defects in the integrated circuit 100.

What is claimed is:

1. A device for identifying a defect in an integrated circuit, comprising:

said integrated circuit emitting light corresponding to said defect in the integrated circuit;

a transforming device to transform the light to electrical signals;

a spectral analyzer to analyze the electrical signals and produce a spectral content signal based on the spectral content of the electrical signals;

a comparison device to compare the spectral content signal with predetermined noise signatures to identify said defect.

2. A method for identifying a defect in an integrated circuit, comprising the steps of:

detecting emitted light corresponding to said defect in the integrated circuit;

transforming the emitted light to electrical signals; analyzing the electrical signals to determine spectral content of the electrical signals;

comparing the spectral content with noise signatures to identify said defect in said integrated circuit.

* * * * *